(12) United States Patent
Li

(10) Patent No.: US 11,398,438 B2
(45) Date of Patent: Jul. 26, 2022

(54) DRIVE BACKPLANE FOR LIGHT-EMITTING DIODE, METHOD FOR PREPARING SAME, AND DISPLAY DEVICE

(71) Applicant: BOE Technology Group Co., Ltd., Beijing (CN)

(72) Inventor: Haixu Li, Beijing (CN)

(73) Assignee: BOE Technology Group Co., LTD., Beijing (CN)

( * ) Notice: Subject to any disclaimer, the term of this patent is extended or adjusted under 35 U.S.C. 154(b) by 0 days.

(21) Appl. No.: 16/973,091

(22) PCT Filed: Mar. 27, 2020

(86) PCT No.: PCT/CN2020/081839
§ 371 (c)(1),
(2) Date: Dec. 8, 2020

(87) PCT Pub. No.: WO2020/244292
PCT Pub. Date: Dec. 10, 2020

(65) Prior Publication Data
US 2021/0265282 A1    Aug. 26, 2021

(30) Foreign Application Priority Data
Jun. 5, 2019 (CN) .......................... 201910486911.2

(51) Int. Cl.
*H01L 23/00* (2006.01)
*H01L 25/16* (2006.01)
*H01L 27/12* (2006.01)

(52) U.S. Cl.
CPC .......... *H01L 23/562* (2013.01); *H01L 25/167* (2013.01); *H01L 27/124* (2013.01); *H01L 27/1259* (2013.01)

(58) Field of Classification Search
None
See application file for complete search history.

(56) References Cited

U.S. PATENT DOCUMENTS

2005/0110090 A1  5/2005  Koo et al.
2011/0042670 A1  2/2011  Sato et al.
(Continued)

FOREIGN PATENT DOCUMENTS

CN    1622339 A    6/2005
CN    103325811 A   9/2013
(Continued)

OTHER PUBLICATIONS

International search report of PCT application No. PCT/CN2020/081839 dated Jun. 29, 2020.
(Continued)

*Primary Examiner* — Bo B Jang
(74) *Attorney, Agent, or Firm* — Fay Sharpe LLP

(57) ABSTRACT

Provided is a drive backplane for a light-emitting diode, including a substrate and a drive structure on the substrate, the drive structure including a thin-film transistor and a stress relief structure; wherein the thin-film transistor includes an active layer on the substrate, a first insulation layer covering the active layer, and a first gate on the first insulation layer; and the stress relief structure is on the first insulation layer and includes a first metal strip on a first side of the first gate and a second metal strip on a second side of the first gate, wherein the first side is opposite to the second side. A method for preparing the light-emitting diode and a display device are further disclosed.

19 Claims, 8 Drawing Sheets

(56) References Cited

U.S. PATENT DOCUMENTS

| | | | |
|---|---|---|---|
| 2012/0161123 A1* | 6/2012 | Yamazaki | ............. H01L 29/247 257/43 |
| 2013/0161608 A1* | 6/2013 | Yamazaki | ............... H01L 29/24 257/43 |
| 2013/0249383 A1 | 9/2013 | Yoo et al. | |
| 2018/0219163 A1 | 8/2018 | Qin | |
| 2019/0181362 A1 | 6/2019 | Tian et al. | |
| 2020/0075767 A1 | 3/2020 | Jang et al. | |

FOREIGN PATENT DOCUMENTS

| | | | |
|---|---|---|---|
| CN | 106169481 A | 11/2016 | |
| CN | 107910296 A | 4/2018 | |
| CN | 109817704 A | 5/2019 | |
| CN | 110190085 A | 8/2019 | |
| JP | 2004119504 A | 4/2004 | |
| KR | 20040105359 A | 12/2004 | |
| KR | 101842796 B1 | 3/2018 | |

OTHER PUBLICATIONS

First office action of Chinese application No. 201910486911.2 dated Nov. 26, 2020.
Notification to grant patent right for invention of Chinese application No. 201910486911.2 dated Mar. 3, 2021.

* cited by examiner

DRIVE BACKPLANE FOR LIGHT-EMITTING DIODE, METHOD FOR PREPARING SAME, AND DISPLAY DEVICE

CROSS-REFERENCE TO RELATED APPLICATIONS

The present disclosure is a 371 of PCT Application No. PCT/CN2020/081839, filed on Mar. 27, 2020, and claims priority to Chinese Patent Application No. 201910486911.2, filed on Jun. 5, 2019 and entitled "DRIVE BACKPLANE FOR LIGHT-EMITTING DIODE, METHOD FOR PREPARING SAME, AND DISPLAY DEVICE", the entire contents of which are incorporated herein by reference.

TECHNICAL FIELD

Embodiments of the present disclosure relate to a drive backplane for a light-emitting diode, a method for preparing the same, and a display device.

BACKGROUND

The technologies of semiconductor light-emitting diodes (LEDs) have been developed for nearly thirty years, from initial solid-state lighting power supplies to backlight sources and LED display screens in the display field, providing a solid foundation for a wider application thereof. With the development of chip producing and packaging technologies, mini light-emitting diode (mini LED) display and micro light emitting diode (micro LED) display have gradually become hot spots of LED drive backplanes. Compared with the technology of organic light-emitting diode (OLED) displays, the micro LED as a new generation of the display technology has higher illuminance, better luminous efficiency, and lower power consumption.

At present, a method for preparing a micro LED drive backplane includes separately preparing a micro LED and a drive backplane, and then bonding the micro LED onto the drive backplane by a transfer process, thereby obtaining the micro LED drive backplane combining the micro LED and the drive backplane.

SUMMARY

Several embodiments of the present disclosure provide a drive backplane for a light-emitting diode. The drive backplane includes a substrate and a drive structure on the substrate, the drive structure including a thin-film transistor and a stress relief structure, wherein the thin-film transistor includes an active layer on the substrate, a first insulation layer covering the active layer, and a first gate on the first insulation layer, the active layer includes a channel region, a first doped region and a second doped region; and the stress relief structure is on the first insulation layer and includes a first metal strip on a first side of the first gate and a second metal strip on a second side of the first gate, wherein the first side is opposite to the second side, and the first metal strip and the second metal strip are provided on the same layer with the first gate and made of the same material.

In some embodiments of the present disclosure, the thin-film transistor further includes a second insulation layer, a third insulation layer, a source electrode, and a drain electrode; wherein the second insulation layer covers the first gate, the first metal strip and the second metal strip; the third insulation layer is on the second insulation layer and is provided with a first via hole and a second via hole, wherein the first doped region is exposed by the first via hole, and the second doped region is exposed by the second via hole; and the source electrode and the drain electrode are provided on the third insulation layer, wherein the source electrode is connected to the first doped region of the active layer by the first via hole and the drain electrode is connected to the second doped region of the active layer by the second via hole, such that the first metal strip is disposed between the first gate and the first via hole, and the second metal strip is disposed between the first gate and the second via hole.

In some embodiments of the present disclosure, both the first metal strip and the second metal strip have a rectangular or arched cross-sectional shape in a plane perpendicular to the substrate.

In some embodiments of the present disclosure, both the first metal strip and the second metal strip are from 2.0 μm to 3.0 μm in width in a plane parallel to the substrate and in a direction perpendicular to the first gate.

In some embodiments of the present disclosure, a spacing distance between the first metal strip and the first gate is from 1.5 μm to 2 μm, and a spacing distance between the second metal strip and the first gate is from 1.5 μm to 2 μm.

In some embodiments of the present disclosure, a spacing distance between the first metal strip and the first via hole is from 1.5 μm to 2 μm, and a spacing distance between the second metal strip and the second via hole is from 1.5 μm to 2 μm.

Several embodiments of the present disclosure further provide a method for preparing a drive backplane for a light-emitting diode. The method includes:

forming an active layer on a substrate, wherein the active layer includes a channel region, a first doped region, and a second doped region;

forming a first insulation layer covering the active layer; and forming a first gate and a stress relief structure on the first insulation layer by a single patterning process, wherein the stress relief structure includes a first metal strip on a first side of the first gate and a second metal strip on a second side of the first gate, wherein the first side is opposite to the second side.

In some embodiments of the present disclosure, the method further includes:

forming a second insulation layer, which covers the first gate, the first metal strip, and the second metal strip;

forming a third insulation layer on the second insulation layer, wherein the third insulation layer is provided with a first via hole and a second via hole, the first doped region is exposed by the first via hole, and the second doped region is exposed by the second via hole; and forming a source electrode and a drain electrode on the third insulation layer, wherein the source electrode is connected to the first doped region by the first via hole, and the drain electrode is connected to the second doped region by the second via hole, wherein the first metal strip is disposed between the first via hole and the first gate and the second metal strip is disposed between the second via hole and the first gate.

In some embodiments of the present disclosure, the first metal strip and the second metal strip have a rectangular or arched cross-sectional shape in a plane perpendicular to the substrate.

In some embodiments of the present disclosure, both the first metal strip and the second metal strip are from 2.0 μm to 3.0 μm in width in a plane parallel to the substrate and in a direction perpendicular to the first gate.

In some embodiments of the present disclosure, a spacing distance between the first metal strip and the first gate is from 1.5 µm to 2 µm, and a spacing distance between the second metal strip and a second gate is from 1.5 µm to 2 µm.

Several embodiments of the present disclosure further provide a display device, which includes the aforementioned drive backplane for the light-emitting diode.

BRIEF DESCRIPTION OF DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and persons of ordinary skill in the art may also derive other drawings from these accompanying drawings without creative efforts.

REFERENCE SIGNS AND DENOTATIONS THEREOF

10—substrate; 11—barrier layer; 12—active layer; 13—first insulation layer; 14—first gate; 15—second insulation layer; 16—second gate; 17—third insulation layer; 18—source electrode; 19—drain electrode; 20—common electrode; 21—fourth insulation layer;

22—first connection electrode; 23—second connection electrode; 30—first metal strip;

40—second metal strip; 100—drive backplane; 200—micro LED.

DESCRIPTION OF EMBODIMENTS

In order to make the objects, technical solutions, and advantages of the present disclosure clearer, the embodiments of the present disclosure will be further described in detail hereinafter with reference to the accompanying drawings. The following embodiments are intended to illustrate the present disclosure and not intended to limit the scope of the present disclosure. It should be noted that the embodiments and the features therein in the present disclosure can be combined mutually in the absence of conflicts.

In the technologies known to the inventors, a micro LED is bonded onto the drive backplane using a transfer process to obtain a micro LED drive backplane combining the micro LED and the drive backplane.

Based on studies, the inventors have found that the characteristics of a thin-film transistor (TFTs) of the drive backplane are greatly affected after the transfer process, which in turn affects the performance of the micro LED drive backplane.

The inventors have found that the influences of the transfer process on the characteristics of the thin-film transistor (TFTs) are mainly manifested in an increase of an off-state current $I_{off}$ and an increase of a subthreshold swing SS. The off-state current $I_{off}$ affects the switch ratio and power consumption characteristics of the TFTs, the subthreshold swing SS affects rate characteristics of mutual conversion between an on state and an off state of the TFTs, and these rate characteristics are important parameters of the TFTs characteristics. Therefore, changes in these characteristics of the TFTs affect the performance of the micro LED drive backplane.

Figure 1:
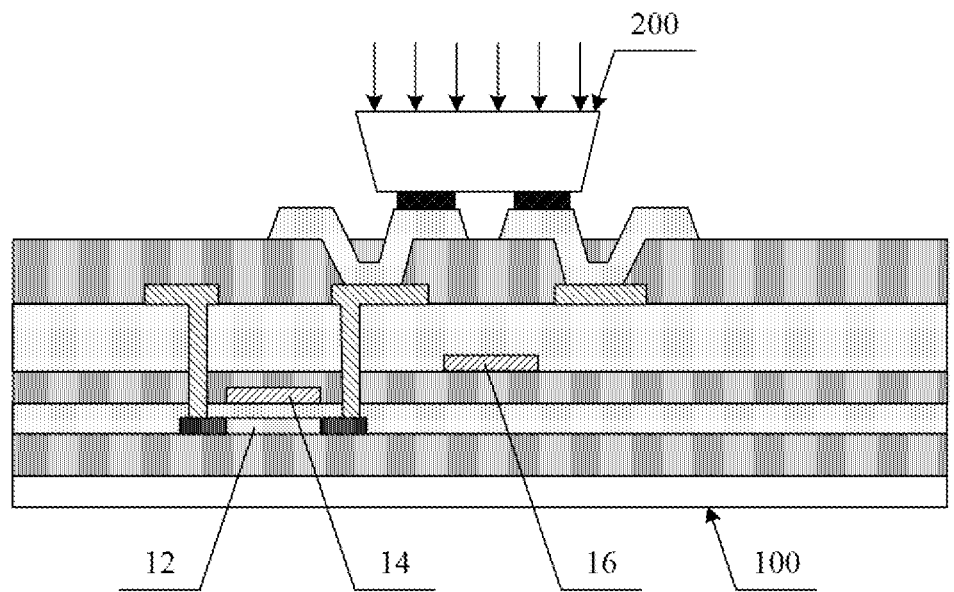
FIG. 1 is a schematic diagram of applying a pressure to a micro LED.
Figure 2:
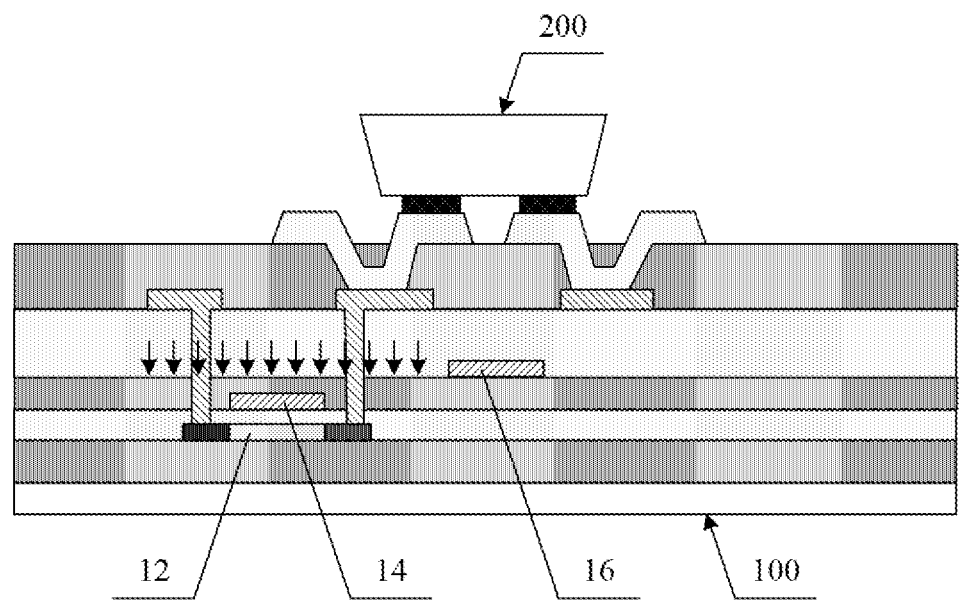
FIG. 2 is a schematic diagram of transmitting a pressure to a film layer where the second gate is disposed.
Figure 3:
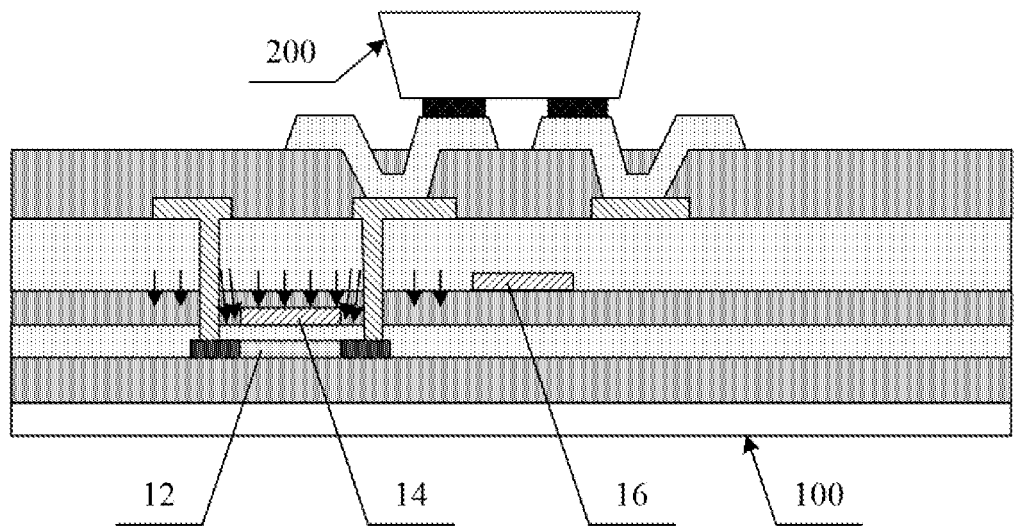
FIG. 3 is a schematic diagram of applying a pressure to a first gate.
Figure 4:
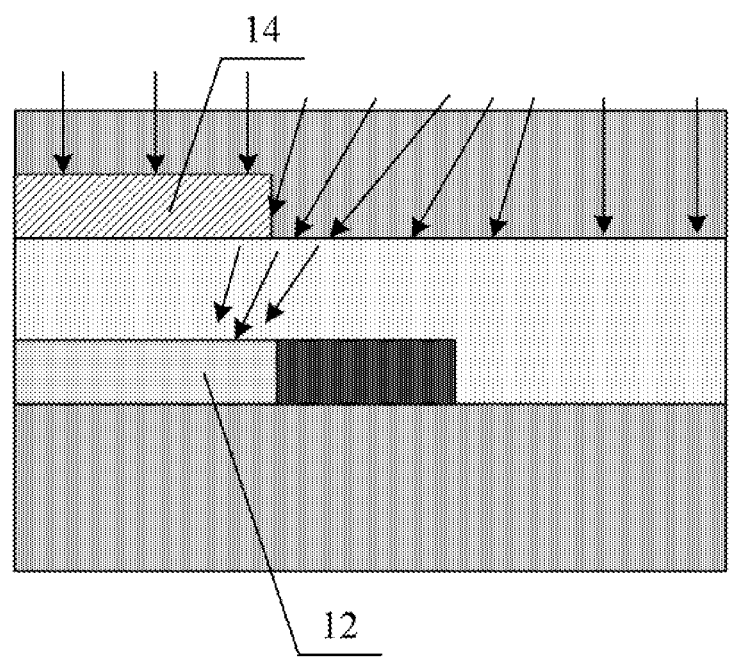
FIG. 4 is an enlarged view showing an edge corner area of the first gate in FIG. 3.

Based on studies, the inventors of the present disclosure have discovered that the influences of the transfer process on the off-state current $I_{off}$ and the subthreshold swing SS are mainly caused by a stress acting on an active layer of the TFTs, and the stress on the active layer is derived from a pressure applied to the micro LED when the micro LED is bonded onto the drive backplane. FIGS. 1 to 4 are schematic diagrams of pressure transmission in a transfer process. FIG. 1 is a schematic diagram of applying a pressure to a micro LED; FIG. 2 is a schematic diagram of transmitting the pressure to a film layer where a second gate 16 is disposed; FIG. 3 is a schematic diagram of applying a pressure to a first gate 14; and FIG. 4 is an enlarged view showing an edge corner area of the first gate 14 in FIG. 3. As shown in FIGS. 1 to 4, the pressure applied to the micro LED 200 is transmitted to the drive backplane 100, and is transmitted downward along respective film layers of the drive backplane 100, and finally acts on several film layers proximal to the active layer 12. When the pressure acts on the first gate 14 by the film layer where the second gate 16 is disposed, the magnitude and direction of the pressure at the edge corners of the first gate 14 vary greatly due to influences of factors such as sharp changes of an edge material and a shape of the first gate 14, and the pressure faces the edge corner of the first gate 14 while increasing, such that stress concentration occurs at the edge corners of the first gate 14. Since the stress facing the edge corners of the first gate 14 will act on a channel region (an undoped region) of the active layer 12, the channel region of the active layer 12 changes in an interface state and an inner trap state, which changes a transmission state and a transmission path of carriers, resulting in the increase in an off-state current $I_{off}$ and the increase in a subthreshold swing SS.

In order to verify the above analysis, the inventors have conducted tests and studies. A total of 4 sets of TFTs are selected for parameter measurement before and after a pressure is applied. The width-to-length ratios W/L of the 4 sets of TFTs are 4/4, 4/8, 10.5/4, and 18/30 respectively. Measurement parameters includes: an on-state current $I_{on}$, an off-state current $I_{off}$, a threshold voltage $V_{th}$, a mobility $M_{ob}$ and a subthreshold swing SS, and 0.1 MPa of pressure is applied for 15 seconds. Measurement results are shown in Table 1.

The studies have shown that the all parameters of the respective sets of TFTs change before and after the pressure is applied, and the off-state current and the subthreshold swing vary greatly, with a trend of change as follows: the off-state current $I_{off}$ increases, and the subthreshold swing SS increases after the pressure is applied. Hence, the above measurement results further prove that the increase in the off-state current $I_{off}$ and the increase in the subthreshold swing SS are caused by the stress acting on the active layers of the TFTs.

metal strip and the second metal strip are provided on the same layer as the first gate and made of the same material; and the first metal strip and the second metal strip are disposed on a first side and a second side of the first gate respectively. The stress relief structure is configured to reduce or eliminate a stress acting on the channel region of the active layer of the thin-film transistor, suppress the increase of the off-state current $I_{off}$ and the increase of the subthreshold swing SS, and stabilize the characteristics of the TFTs.

In the drive backplane for the light-emitting diode according to an embodiment of the present disclosure, by providing the stress relief structure, which is configured to reduce or eliminate the stress acting on the channel region of the active layer of the thin-film transistor, in the thin-film transistor, the change degrees of the interface state and the inner trap state of the channel region of the active layer are reduced, and the change degrees of the transmission state and the transmission path of the carriers are reduced. In this way, the increase degrees of the off-state current $I_{off}$ and the subthreshold swing SS are suppressed, thereby stabilizing the characteristics of the TFTs.

The drive backplane for the light-emitting diode according to the embodiments of the present disclosure will be described in detail below in combination with specific embodiments.

Figure 5:
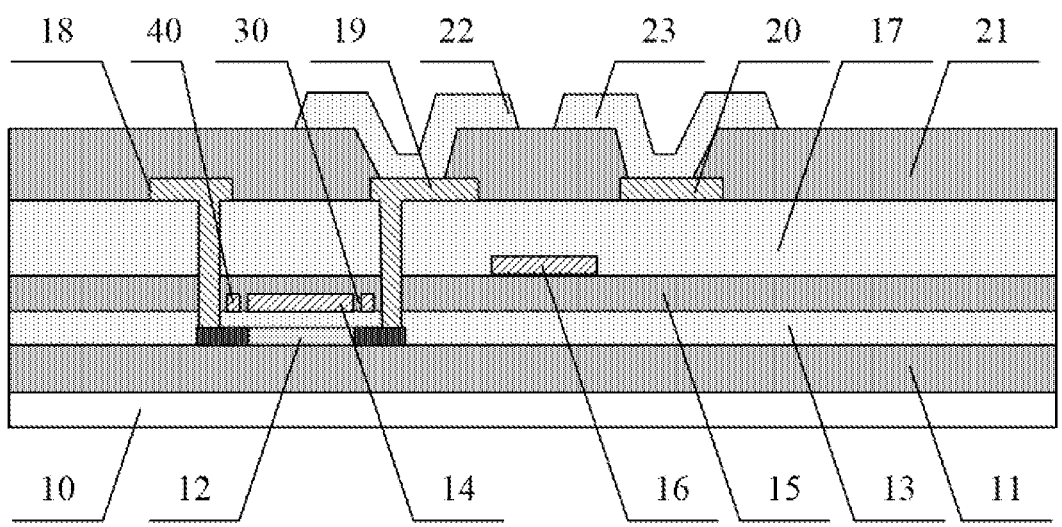
FIG. 5 is a schematic structural diagram of a drive backplane for a light-emitting diode according to an embodiment of the present disclosure.

FIG. 5 is a schematic structural diagram of a drive backplane for a light-emitting diode according to some embodiments of the present disclosure. As shown in FIG. 5, the drive backplane for the light-emitting diode includes a

TABLE 1

| | Parameter | Before pressure application | After pressure application |
|---|---|---|---|
| First set of TFTs (W/L = 4/4) | $I_{on}$ | 1.1E−4 (A) | 8.2E−5 (A) |
| | $I_{off}$ | 3.8E−14 (A) | 4.2E−13 (A) |
| | $V_{th}$ | −0.09 V | 1.39 V |
| | $M_{ob}$ | 69.35 (cm$^2$/v · s) | 46.75 (cm$^2$/v · s) |
| | SS | 0.28 | 0.54 |
| Second set of TFTs (W/L = 4/8) | $I_{on}$ | 5.5E−5 (A) | 2.7E−5 (A) |
| | $I_{off}$ | 6.4E−14 (A) | 8.4E−13 (A) |
| | $V_{th}$ | −0.53 V | −1.76 V |
| | $M_{ob}$ | 78.28 (cm$^2$/v · s) | 51.62 (cm$^2$/v · s) |
| | SS | 0.28 | 0.39 |
| Third set of TFTs (W/L = 10.5/4) | $I_{on}$ | 2.8E−4 (A) | 3.3E−4 (A) |
| | $I_{off}$ | 2.1E−13 (A) | 1.6E−13 (A) |
| | $V_{th}$ | −0.57 V | −0.6 V |
| | $M_{ob}$ | 69.84 (cm$^2$/v · s) | 79.65 (cm$^2$/v · s) |
| | SS | 0.24 | 0.28 |
| Fourth set of TFTs (W/L = 18/30) | $I_{on}$ | 4.6E−5 (A) | 4.6E−5 (A) |
| | $I_{off}$ | 1.5E−12 (A) | 1.1E−12 (A) |
| | $V_{th}$ | −1.31 V | −1.35 V |
| | $M_{ob}$ | 75.81 (cm$^2$/v · s) | 76.00 (cm$^2$/v · s) |
| | SS | 0.24 | 0.32 |

In order to overcome the problem that the transfer process affects the characteristics of the TFTs in the technologies known to the inventors, embodiments of the present disclosure provide a drive backplane for a light-emitting diode. The drive backplane for the light-emitting diode according to the embodiments of the present disclosure includes a substrate and a drive structure. The drive structure is provided on the substrate and includes a thin-film transistor and a stress relief structure. The thin-film transistor includes an active layer, a first insulation layer and a first gate, wherein the active layer is provided on the substrate and includes a channel region and doped regions; the first insulation layer covers the active layer; and the first gate is provided on the second insulation layer. The stress relief structure includes a first metal strip and a second metal strip, wherein the first substrate 10 and a drive structure. The drive structure is provided on the substrate 10 and includes a thin-film transistor, a stress relief structure, a second gate, and a common electrode. The thin-film transistor includes an active layer, a first gate, a source electrode, and a drain electrode. In the structure shown in FIG. 5, the stress relief structure includes a first metal strip on a first side of the first gate and a second metal strip on a second side of the first gate, wherein the first side of the first gate is opposite to the second side of the first gate. In some embodiments of the present disclosure, the drive backplane for the light-emitting diode includes:

a substrate 10;

a barrier layer 11 provided on the substrate 10;

an active layer 12, which is provided on the barrier layer 11 and includes a channel region, a first doped region, and a second doped region, wherein the first doped region and the second doped region are respectively disposed on both sides of the channel region;

a first insulation layer 13 covering the active layer 12;

a first gate 14 provided on the first insulation layer 13;

a first metal strip 30 and a second metal strip 40, wherein the first metal strip 30 is provided on a first side of the first gate 14 and the second metal strip 40 is provided on a second side of the first gate 14, wherein the first side is opposite to the second side;

a second insulation layer 15 covering the first gate 14, the first metal strip 30 and the second metal strip 40;

a second gate 16 provided on the second insulation layer 15;

a third insulation layer 17, which covers the second gate 16 and is provided with a first via hole and a second via hole thereon, wherein the first via hole and the second via hole expose the first doped region and the second doped region respectively;

a source electrode 18, a drain electrode 19 and a common electrode 20, which are all provided on the third insulation layer 17, wherein the source electrode 18 is connected to the first doped region by the first via hole, and the drain electrode 19 is connected to the second doped region by the second via hole;

a fourth insulation layer 21, which covers the source electrode 18, the drain electrode 19 and the common electrode 20, and is provided with a third via hole and a fourth via hole, wherein the drain electrode 19 is exposed by the third via hole, and the common electrode 20 is exposed by the fourth via hole expose; and a first connection electrode 22 and a second connection electrode 23, both of which are provided on the fourth insulation layer 21, wherein the first connection electrode 22 is connected to the drain electrode 19 by the third via hole, and the second connection electrode 23 is connected to the common electrode 20 by the fourth via hole.

The first metal strip 30 and the second metal strip 40 are provided on both sides of the first gate 14, and are configured to reduce stress concentration at the edge corners of the first gate 14 when the micro LED is bonded, thereby further reducing the stress acting on the channel region of the active layer 12. The positions of the first metal strip 30 and the second metal strip 40 correspond to the positions of the first doped region and the second doped region. That is, an orthographic projection of the first metal strip 30 on the substrate 10 is within an orthographic projection of the first doped region of the active layer 12 on the substrate 10; and an orthographic projection of the second metal strip 40 on the substrate 10 is within an orthographic projection of the second doped region of the active layer on the substrate 10.

The technical solutions according to the embodiments of the present disclosure are further described below by way of a method for preparing a drive backplane for a light-emitting diode. The term "patterning process" in the embodiments of the present disclosure includes treatments such as film layer deposition, photoresist coating, mask exposure, development, etching, and photoresist stripping, which belongs to a mature preparation process in the related technologies. The deposition may include known processes such as sputtering deposition, vapor deposition, and chemical vapor deposition, the coating may include a known coating process, and the etching may include a known method, all of which are not limited here.

A method for preparing the drive backplane for the light-emitting diode according to the embodiments of the present disclosure includes the following steps:

forming a pattern of an active layer;

forming patterns of a first gate, a first metal strip and a second metal strip;

forming a pattern of a second gate;

forming a pattern of a third insulation layer;

forming patterns of a source electrode, a drain electrode and a common electrode;

forming a pattern of a fourth insulation layer; and forming patterns of connecting electrodes.

Figure 6:
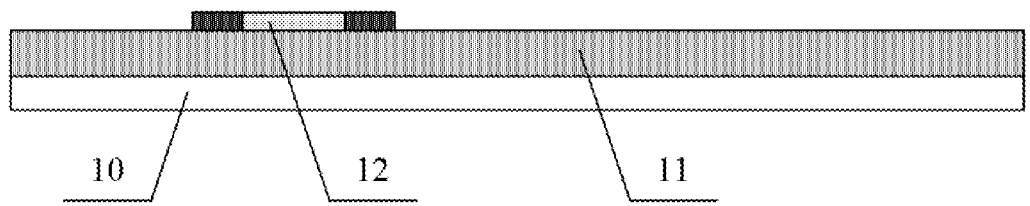
FIG. 6 is a schematic diagram of a structure obtained after forming a pattern of an active layer on a substrate according to an embodiment of the present disclosure.

Forming the pattern of the active layer includes the following steps: a barrier film and an active layer film are sequentially deposited on the substrate 10, and the active layer film is patterned by a patterning process to form the pattern of the active layer 12 disposed on the barrier layer 11. The active layer 12 includes a channel region, a first doped region and a second doped region, and the first doped region and the second doped region are disposed on both sides of the channel region respectively, as shown in FIG. 6. The barrier film may be made of silicon nitride SiNx or silicon oxide SiOx and the like, and may be either a single layer or a silicon nitride/silicon oxide multilayer structure. The barrier layer 11 is configured to improve the resistance of the substrate 10 against water and oxygen, and prevent metal ions in the substrate from diffusing to the active layer, thereby avoiding influences on the characteristics such as a threshold voltage and a leakage current. The active layer film may be made of materials such as amorphous silicon (a-Si), low-temperature polysilicon (LTPS) or semiconductor oxides. It is necessary to perform corresponding treatments before and after the patterning process according to the used material of the active layer film.

Taking the preparation of an active layer from the low-temperature polysilicon (LTPS) as an example, the preparation process includes the following steps: a barrier material film and an amorphous silicon film are sequentially deposited on the substrate 10, and the amorphous silicon film is treated by using a laser irradiation method to crystalize the amorphous silicon film into a polysilicon film; a layer of photoresist is coated on the polysilicon film, and is stepwise exposed and developed by using a halftone mask or a gray-tone mask, to form a first photoresist region at the position of the channel region, a second photoresist region at the first doped region and the second doped region and complete photoresist removal regions at the remaining positions, wherein the first photoresist region is not exposed and has a first thickness, the second photoresist region is partially exposed and has a second thickness, and the first thickness is greater than the second thickness; the polysilicon film is removed from the complete photoresist removal regions by using an etching process to form the pattern of the active layer; the photoresist is ashed to reduce the thickness of the first photoresist region and remove the photoresist from the second photoresist region, and ions are implanted to the exposed active layer by using an ion implantation method to form a first doped region and a second doped region; and finally, the remaining photoresist is stripped to form the pattern of the LTPS active layer including the channel region and the first and second doped regions disposed on both sides of the channel region. In practice, the pattern of an LTPS active layer including a heavily drain doped (HDD) region, a lightly drain doped (LDD) region, and an undoped region may also be formed.

Figure 7:
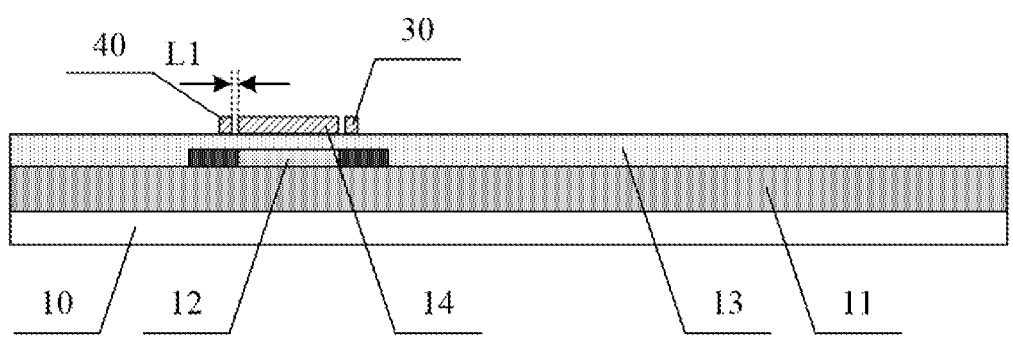
FIG. 7 is a schematic diagram of a structure obtained after forming patterns of a first gate and a first metal strip on the substrate according to an embodiment of the present disclosure.

Forming the patterns of the first gate, the first metal strip and the second metal strip includes the following steps: a first insulation layer 13 covering the active layer 12 is formed on the substrate on which the aforementioned pattern is formed, and a first metal film is formed on the first insulation layer 13; the first meal film is patterned with a patterning process to form a first gate 14, a first metal strip 30, and a second metal strip 40, all of which are provided on the first insulation layer 13, wherein the first metal strip 30 and the second metal strip 40 are disposed on both sides of the first gate 14, as shown in FIG. 7. In some embodiments of the present disclosure, the first insulation layer 13 may be formed by deposition. In some embodiments of the present disclosure, the first metal film may be formed by deposition, and of course, may also be formed in other manners such as magnetron sputtering. In some embodiments of the present disclosure, in a plane perpendicular to the substrate, an orthographic projection of the first gate 14 on the substrate overlaps with an orthographic projection of the channel region of the active layer 12 on the substrate; the first metal strip 30 and the second metal strip 40 both have a rectangular cross-sectional shape in a direction perpendicular to the substrate, and are from 2.0 μm to 3.0 μm in width in a direction parallel to the substrate; and a spacing distance L1 between the first metal strip 30 and the first gate 14 is from 1.5 μm to 2 μm, and a spacing distance between the second metal strip 40 and the first gate 14 is from 1.5 μm to 2 μm. The first insulation layer 13 is also referred to as a first gate insulation (GI) layer. In actual practice, the first metal strip 30 may also have a trapezoidal cross-sectional shape.

Figure 8:
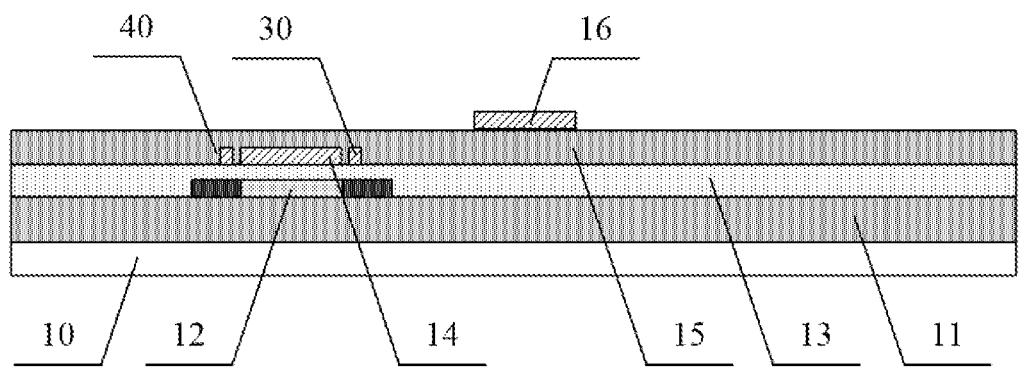
FIG. 8 is a schematic diagram of a structure obtained after forming a pattern of a second gate on the substrate according to an embodiment of the present disclosure.

Forming the pattern of the second gate includes the following steps: a second insulation layer 15 covering the first gate 14, the first metal strip 30 and the second metal strip 40 is formed on the substrate on which the aforementioned patterns are formed, and a second metal film is formed on the second insulation layer 15; the second metal film is patterned with a patterning process to form a second gate 16 disposed on the second insulation layer 15, as shown in FIG. 8. The second insulation layer 15 may be formed by deposition, and is also referred to as a second gate insulation (GI) layer; and the second metal film may be formed by deposition or in other manners such as magnetron sputtering.

Figure 9:
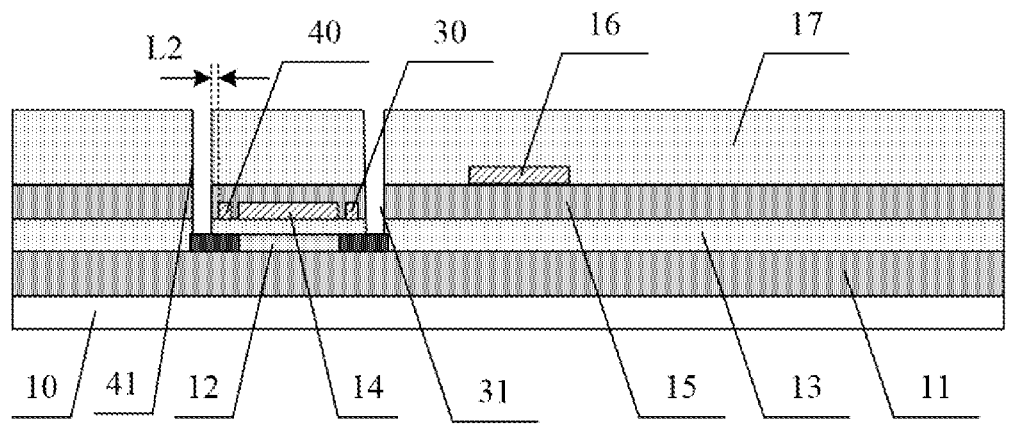
FIG. 9 is a schematic diagram of a structure obtained after forming a pattern of a third insulation layer on the substrate according to an embodiment of the present disclosure.

Forming the pattern of the third insulation layer includes the following steps: a third insulation layer 17 is formed on the substrate on which the aforementioned pattern is formed; a first via hole and a second via hole are formed by a patterning process, with the first via hole and the second via hole both penetrating through the third insulation layer 17, the second insulation layer 15 and the first insulation layer 13, to expose the first doped region and the second doped region of the active layer 12 respectively, as shown in FIG. 9. In some embodiments of the present disclosure, a spacing distance L2 between the first metal strip 30 and the first via hole is from 1.5 μm to 2 μm, and a spacing distance between the second metal strip 40 and the second via hole is from 1.5 μm to 2 μm. The third insulation layer is also called as an interlayer insulation layer.

Figure 10:
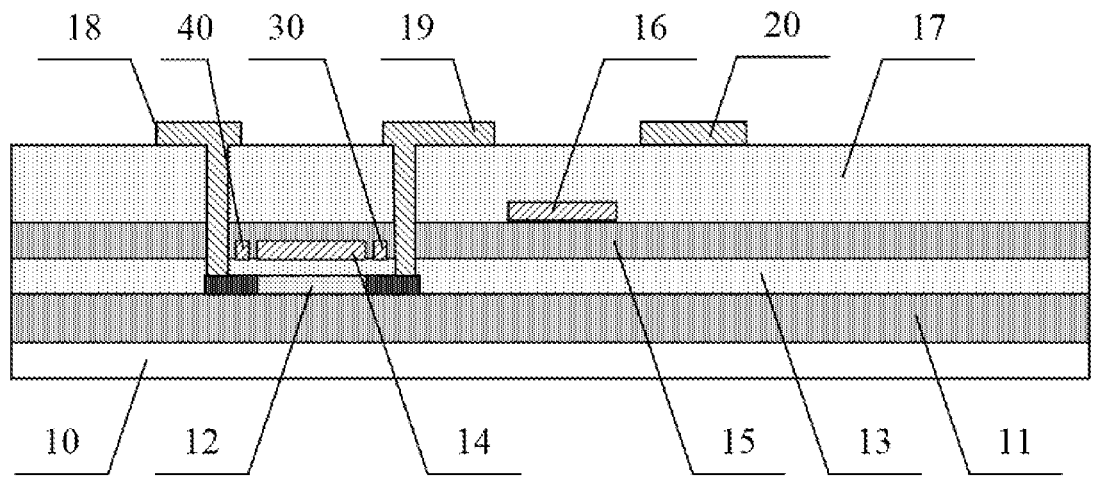
FIG. 10 is a schematic diagram of a structure obtained after patterns of a source electrode and a drain electrode are formed on the substrate according to an embodiment of the present disclosure.

Forming the patterns of the source electrode, the drain electrode and the common electrode includes the following steps: a third metal film is formed on the third insulation layer 17 and is patterned with the patterning process to form patterns of a source electrode 18, a drain electrode 19 and a common electrode 20, wherein the source electrode 18 is connected to the first doped region by the first via hole, and the drain electrode 19 is connected to the second doped region by the second via hole, as shown in FIG. 10.

Figure 11:
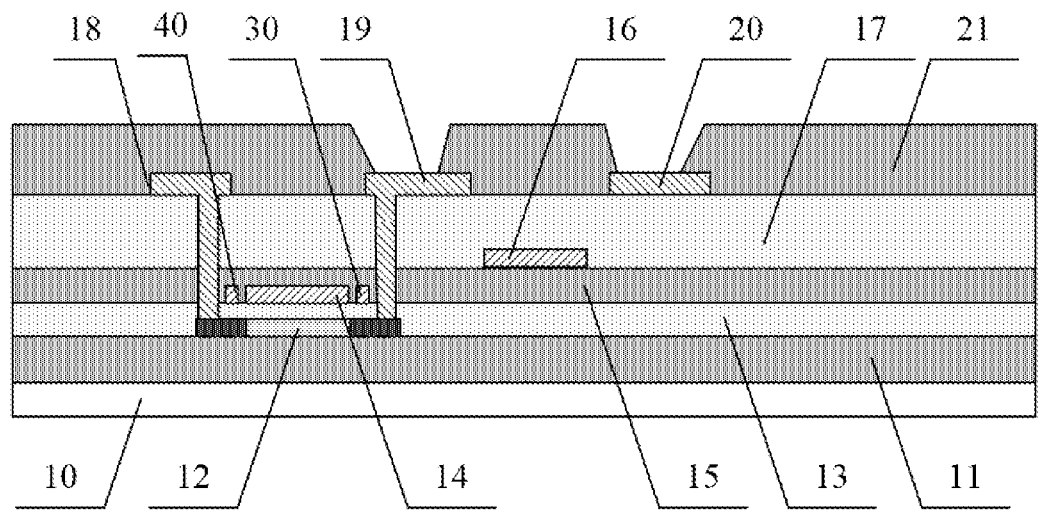
FIG. 11 is a schematic diagram of a structure obtained after forming a pattern of a fourth insulation layer on the substrate according to an embodiment of the present disclosure.

Forming the pattern of the fourth insulation layer includes the following steps: a fourth insulation layer is formed on the substrate on which the aforementioned patterns are formed; and the fourth insulation layer is patterned with the patterning process to form third and fourth via holes penetrating through the fourth insulation layer 21, to expose the drain electrode 19 and the common electrode 20, respectively, as shown in FIG. 11. The fourth insulation layer is also referred to as a planarization layer (PLN).

Forming the pattern of the connection electrodes includes the following steps: a transparent conductive film is formed on the substrate on which the aforementioned patterns are formed; and the transparent conductive film is patterned with the patterning process to form patterns of a first connection electrode 22 and a second connection electrode 23, wherein the first connection electrode 22 is connected to the drain electrode 19 by the third via hole, and the second connection electrode 23 is connected to the common electrode 20 by the fourth via hole, as shown in FIG. 5. For example, the transparent conductive film may be formed from indium tin oxide ITO or indium zinc oxide IZO, and the first connection electrode 22 and the second connection electrode 23 are configured to be bonded to the two electrodes of the micro LED. Hereto, the preparation of the drive backplane for the light-emitting diode according to the embodiments of the present disclosure is completed.

Figure 12:
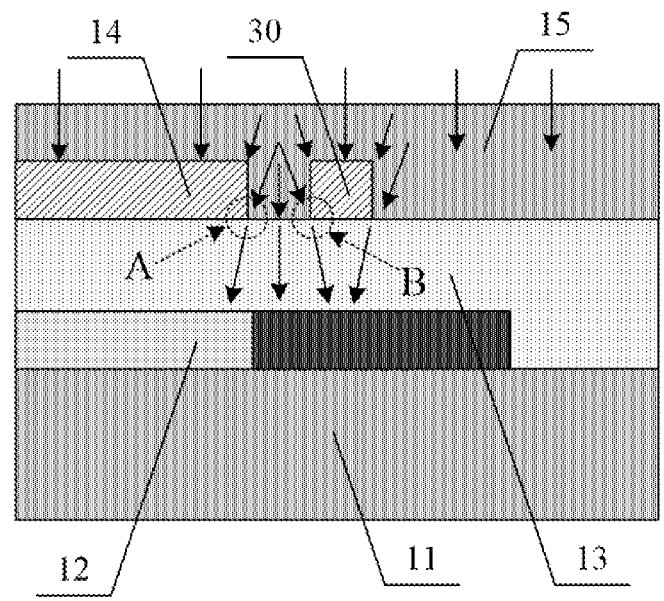
FIG. 12 is a schematic diagram of stressing a stress relief structure according to an embodiment of the present disclosure.

FIG. 12 is a schematic diagram of stressing a stress relief structure according to an embodiment of the present disclosure, showing an enlarged view of edge corner areas of the first gate. When a pressure applied in the case that the micro LED is bonded is transmitted to the film layer where the first gate 14 and the first metal strip 30 are disposed, both the magnitude and direction of the pressure at the edge corner (shown as a region A) of the first gate 14 and at the edge corner (shown as a region B) of the first metal strip 30 vary greatly due to the influences of factors such as sharp changes of edge materials and shapes of the first gate 14 and the first metal strip 30, and the directions of the pressures face the edge corners of the first gate 14 and the edge corners of the first metal strip 30 respectively, such that stress concentrations occur at the edge corners of both the first gate 14 and the first metal strip 30. Since the pressures transmitted to the locations of the first gate 14 and the first metal strip 30 are constant, the stress concentrations occur in the region A and the region B at the same time, result in that the stress value of each region is greatly reduced, and the value of a stress transmitting from the edge corner (the region A) of the first gate 14 to the channel region of the active layer 12 is significantly reduced. Although a part of the stress will be transmitted from the edge corner (the region B) of the first metal strip 30 to the doped regions of the active layer 12, this part of stress has no effect on the characteristics of the TFTs since the carriers do not change in the doped regions of the active layer 2. Therefore, as compared with the stress concentration occurring at only one position at the edge corner of the first gate 14, the first metal strip 30 and the second metal strip 40 are provided in this embodiment in the drive backplane for the light-emitting diode according to the embodiment of the present disclosure, such that the stress concentration occurring at the edge corner of the first gate 14 is redistributed to simultaneously occur at the edge corner of the first gate 14 and at the edge corners of the first and second metal strips 30 and 40 adjacent to the first gate 14. Therefore, the stresses acting on the channel region of the active layer 12 are effectively reduced, the change degrees of the interface state and the inner trap state of the channel region of the active layer are reduced, and the change degrees of the transmission state and the transmission path of the carriers are reduced. As a result, the increase degrees of the off-state current $I_{off}$ and the subthreshold swing SS are further suppressed.

Based on the relationship between a piezoresistive effect and the stress, the relationship between carrier mobility and the stress can be represented as:

$$\frac{\Delta \mu}{\mu} = \frac{\Delta \rho_i}{\rho} = -\pi_{ij}\sigma_j,$$

wherein $\Delta\mu = \mu_i - \mu_{iO}$ is a change quantity of the mobility, and $\Delta\rho_i$ is a change quantity of a resistivity component $\rho_i$. From the above formula, it can be seen that under the action of the stresses, the mobility of the carriers tends to change, with a relative change rate being a product of a piezoresistive coefficient $\pi_{ij}$ and the stress $\sigma_j$.

The inventors have known that the stress concentration in the structure only occurs at the edge corner of the first gate, where all the stresses act on this area with a larger stress value. The stress concentration in the structure according to the embodiment of the present disclosure occurs at the edge corner of the first gate and at the edge corners of the first metal strip and the second metal strip, respectively. The stresses act on four regions (the left and right sides of the first gate), and part of the stresses are loaded on the edge corner of the first metal strip and the second metal strip, such that the stress value at the edge corners of the first gate is reduced, and the stress concentration tendency is decreased, which thereof reduces the stresses acting on the channel region of the active layer. As a result, the mobility of the carriers of the active layer can be reduced, thereby stabilizing the characteristics of the TFTs.

Figure 13:
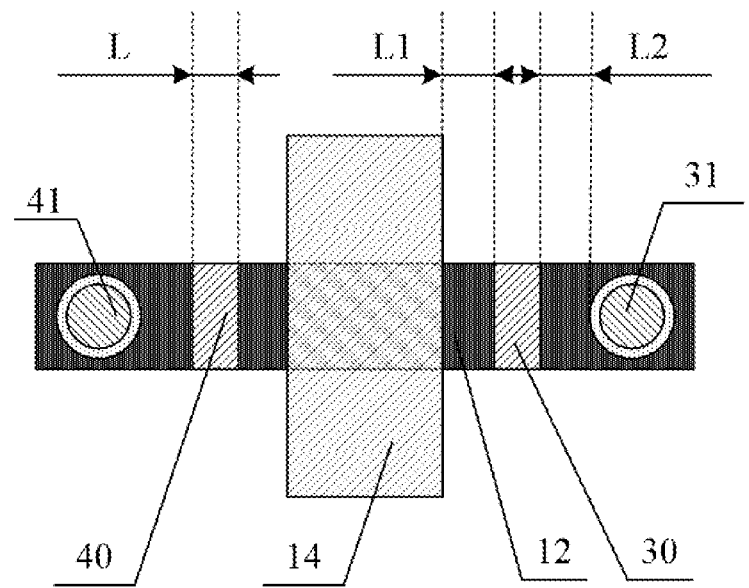
FIG. 13 is a schematic diagram of a position of the first metal strip according to an embodiment of the present disclosure.

FIG. 13 is a plan view in a direct parallel to the plane of the substrate, which schematically shows the position of the first metal strip according to an embodiment of the present disclosure. As shown in FIG. 13, the first metal strip 30 is disposed in an area between the first gate 14 and the first via hole 31 and on a connecting line between the first gate 14 and the first via hole; and the second metal strip 40 is disposed in an area between the first gate 14 and the second via hole 41 and on a connecting line between the first gate 14 and the second via hole 41. In some embodiments of the present disclosure, the first metal strip 30 and the second metal strip 40 have a width L from 2.0 μm to 3.0 μm in width; a spacing distance L1 between the first metal strip 30 and the first gate 14 is from 1.5 μm to 2 μm; and a spacing distance L2 between the first metal strip 30 and the first via hole 31 is from 1.5 μm to 2 μm. Similarly, a spacing distance between the second metal strip 40 and the first gate 14 is from 1.5 μm to 2 μm; and a spacing distance between the second metal strip 40 and the second via hole 41 is from 1.5 μm to 2 μm. In some embodiments of the present disclosure, L1=L2. The first metal strip 30 and the second metal strip 40 extend in a direct parallel to the first gate 14 to form a strip shape, and the lengths of the first metal strip 30 and the second metal strip 40 in the extending direction are greater than or equal to that of the active layer 12 in this direction.

In some embodiments of the present disclosure, the width L of the first metal strip 30 and the spacing distance L1 may be set based on the distance between the first gate 14 and the first via hole 31. If the distance between the first gate 14 and the first via hole 31 is L0, then L=¼–½*L0, L1=¼–½*L0 can be set.

It can be seen from the description above, that in the embodiment of the present disclosure, by providing the first metal strip and the second metal strip on both sides of the first gate respectively, the first metal strip and the second metal strip reduce the stress values at the edge corners of the first gate, such that the stresses acting on the channel region of the active layer are reduced, the change degrees of the interface state and the inner state of the channel region of the active layer are reduced, and the change degrees of the transmission state and the transmission path of the carriers are reduced, which in turn suppresses the increase degrees of the off-state current $I_{off}$ and the subthreshold swing SS, thereby stabilizing the characteristics of the TFTs. Therefore, the problem that the transfer process in the related technologies affects the characteristics of the TFTs is effectively overcome. In addition, the method for preparing the drive backplane for the light-emitting diode according to the embodiments of the present disclosure can adopt existing mature preparation apparatus, and can be well compatible with existing preparation processes, which results in advantages such as simple process, ease for implementation, and low production cost, thereby having good application prospect.

Figure 14:
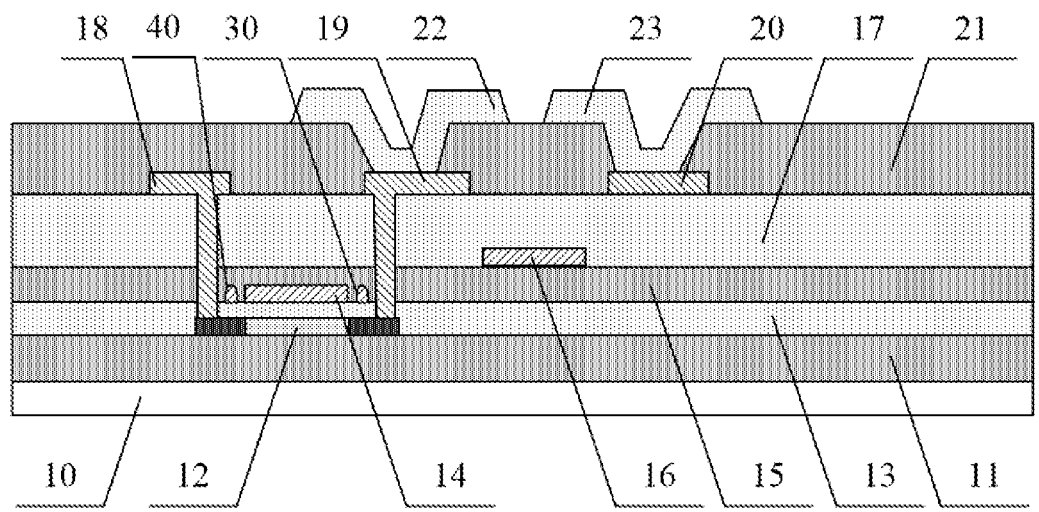
FIG. 14 is a schematic structural diagram of a drive backplane for a light-emitting diode according to another embodiment of the present disclosure.

FIG. 14 is a schematic structural diagram of a drive backplane for a light-emitting diode according to another embodiment of the present disclosure. As shown in FIG. 14, the drive backplane for the light-emitting diode includes a substrate 10 and a drive structure. The drive structure is provided on the substrate 10 and includes a thin-film transistor, a stress relief structure, a second gate, and a common electrode, wherein the thin-film transistor includes an active layer 12, a first gate 14, a source electrode 19, and a drain electrode 18. The stress relief structure includes a first metal strip 30 and a second metal strip 40. The first metal strip 30 and the second metal strip 40 are provided on the first insulation layer 13, and disposed on a first side and a second side of the first gate 14 respectively. The first metal strip 30 and the second metal strip 40 are configured to eliminate stress concentration at the edge corners of the first gate 14 when the micro LED is bonded, thereby further eliminating a stress acting on the channel region of the active layer 12. The first side is opposite to the second side. In a plane perpendicular to the substrate, the first metal strip 30 and the second metal strip 40 have an arched cross-sectional shape. The positions, sizes, and other parameters of the first metal strip 30 and the second metal strip 40 are the same as those of the first metal strip 30 and the second metal strip 40 shown with reference to FIG. 13.

Figure 15:
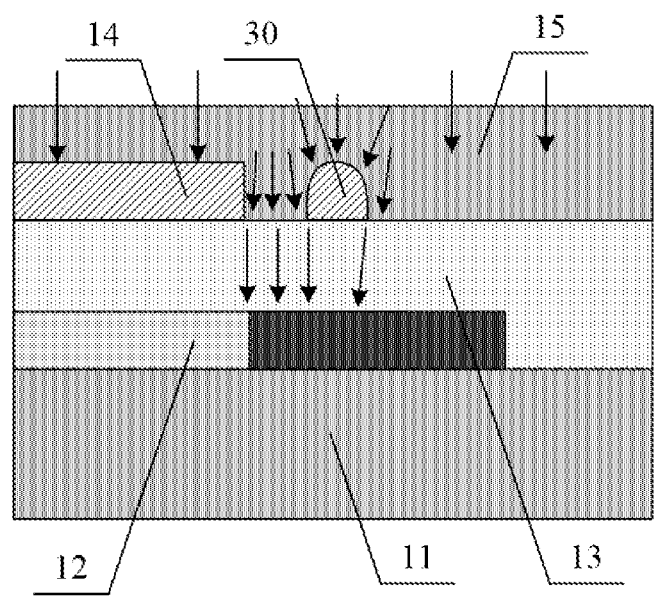
FIG. 15 is a schematic diagram of stressing a stress relief structure according to another embodiment of the present disclosure.

FIG. 15 is a schematic diagram of stressing a stress relief structure according to another embodiment of the present disclosure, which shows an enlarged view of an edge corner area of the first gate. The first metal strip has the arched cross-sectional shape, of which a smooth arc profile has a shape with the best stressed support structure, the most uniform stress distribution and least possibility of stress concentration in the classical mechanics. Therefore, when the pressure applied by bonding the micro LED is transmitted to an area between the first gate 14 and the first metal strip 30, the pressure acting on the area between the first gate and the first metal strip can be well relieved. Moreover, the pressure is mainly concentrated in an arc surface of the second metal strip 40, thereby minimizing the probability of stress concentration at the edge corners of the first gate. That is, the edge corners of the first gate are not prone to the stress concentration. In this way, the stress concentration at the edge corners of the first gate is basically eliminated; the stresses transmitted from the edge corners of the first gate to the channel region of the active layer 12 is thereof basically eliminated. In this way, the changes of the interface state and the inner trap state of the channel region of the active layer are avoided; and the changes of the transmission state and the transmission path of the carriers are avoided. As a result, the increases of the off-state current $I_{off}$ and the subthreshold swing SS are further eliminated.

As compared with the embodiments where the cross sections, perpendicular to the substrate, of the first metal strip 30 and the second metal strip 40 are set to be rectangular, the embodiments where the cross sections, perpendicular to the substrate, of the first metal strip 30 and the second metal strip 40 are set to be arched can achieve the same technical effect. That is, by providing the first metal strip 30 and the second metal strip 40 on both sides of the first gate, the first and second metal strips 30 and 40 reduce the stress values at the edge corners of the first gate, and reduce the stresses acting on the channel region of the active layer, thereby suppressing the increase degrees of the off-state current $I_{off}$ and the subthreshold swing SS, and stabilizing the characteristics of the TFTs. Moreover, since the cross-sectional shapes of the first and second metal strips 30 and 40 are set to be arched, the smooth arc profile well relieves the pressures acting on the areas between the first gate and the first and second metal strips 30 and 40, such that the edge corners of the first gate are less liable to the stress concentration. As a result, the stress concentration at the edge corner of the first gate is substantially eliminated, the stresses transmitted from the edge corners of the first gate to the channel region of the active layer are substantially removed, and the increases of the off-state current $I_{off}$ and the subthreshold swing SS are eliminated.

The process for preparing the drive backplane for the light-emitting diode shown in FIG. 14 according to the embodiments of the present disclosure is basically the same as the preparation process shown in FIGS. 6 to 11 above, with a difference that the cross sections, perpendicular to the substrate, of the first metal strip 30 and the second metal strip 40 need to be set in an arched shape. This can be implemented by adjusting an etching gas, an etching time and in other manners well-known to those skilled in the art, which is not repeated herein.

On the basis of the above embodiments, the stress relief structure can also be expanded in various ways based on the technical concept of the present disclosure. For example, although the above embodiments are described with the first and second metal strips provided on both sides of the first gate respectively by way of example, a plurality of the first and second metal strips may be provided under permitted process conditions, and the stress values at the edge corners of the first gate can be further reduced by generating a plurality of stress concentration points at the same time. For another example, the first metal strip may be either a strip-shaped integrated structure or a split structure composed of multiple blocks, in a direction parallel to the first gate. This may similarly reduce or eliminate the stress at the edge corners of the first gate.

Based on the technical concept of the above embodiments, several embodiments of the present disclosure further provide a method for preparing a drive backplane for a light-emitting diode. The method includes the following steps:

forming an active layer on a substrate, wherein the active layer includes a channel region, a first doped region and a second doped region;

forming a first insulation layer covering the active layer; and forming a first gate and a stress relief structure on the first insulation layer by a single patterning process, wherein the stress relief structure includes a first metal strip and a second metal strip, both of which are disposed on both sides of the first gate.

After the first gate and the stress relief structure are formed, the method further includes the following steps:

forming a second insulation layer covering the first gate, the first metal strip, and the second metal strip;

forming a third insulation layer on the second insulation layer, wherein the third insulation layer is provided with a first via hole and a second via hole, and the first doped region is exposed by the first via hole, and the second doped region is exposed by the second via hole; and forming a source electrode and a drain electrode on the third insulation layer, wherein the source electrode is connected to the first doped region by the first via hole, and the drain electrode is connected to the second doped region by the second via hole, wherein the first metal strip is disposed between the first gate and the first via hole and the second metal strip is disposed between the first gate and the second via hole.

In some embodiments of the present disclosure, the first metal strip and the second metal strip have a rectangular or arched cross-sectional shape in a plane perpendicular to the substrate.

In some embodiments of the present disclosure, the first metal strip and the second metal strip are from 2.0 μm to 3.0 μm in width in a direction parallel to the first insulation layer and perpendicular to the first gate.

In some embodiments of the present disclosure, a spacing distance between the first metal strip and the first gate is from 1.5 μm to 2 μm, and a spacing distance between the second metal strip and the first gate is from 1.5 μm to 2 μm.

In some embodiments of the present disclosure, a spacing distance between the first metal strip and the first via hole is from 1.5 μm to 2 μm, and a spacing distance between the second metal strip and the second via hole is from 1.5 μm to 2 μm.

The method for preparing the drive backplane for the light-emitting diode according to this embodiment and the structure of the prepared drive backplane for the light-emitting diode have been described in detail in the above embodiments, which are not be repeated here.

In the method for preparing the drive backplane for the light-emitting diode according to this embodiment of the present disclosure, by providing the first metal strip and the second metal strip on both sides of the first gate respectively, the first metal strip and the second metal strip reduce the stress values at the edge corners of the first gate, such that the stresses acting on the channel region of the active layer are reduced, the change degrees of the interface state and the inner trap state of the channel region of the active layer are reduced, and the change degrees of the transmission state and the transmission path of the carriers are reduced, which in turn suppresses the increase degrees of the off-state current $I_{off}$ and the subthreshold swing SS, thereby stabilizing the characteristics of the TFTs. Therefore, the problem that the transfer process in the related technologies affects the characteristics of the TFTs is effectively overcome. In addition, the method for preparing the drive backplane for the light-emitting diode according to this embodiment can be implemented by using the existing preparation apparatus, and can be well compatible with the existing preparation process, which results in advantages such as simple process, ease in implementation and low production cost, thereby having good application prospects.

Based on the same technical concept, several embodiments of the present disclosure further provide a display device, which includes the drive backplane for the light-emitting diode according to the above embodiments. The display device may include a mobile phone, a tablet computer, a television, a displayer, a notebook computer, a digital photo frame, a navigator, or any products or components that have a display function.

In the description of the embodiments of the present invention, it should be understood that terms such as "middle," "upper," "lower," "front," "back," "vertical," "horizontal," "top," "bottom," "inside," "outside," and other terms indicating direction or position relations based on the direction or position relations as shown in the accompanying drawings are merely for the convenience of describing the present disclosure and simplifying the description instead of indicating or implying the necessary specific direction, the specific direction structure and operation of a device or element referred to, therefore, these terms should not be construed as limiting the present disclosure.

In the description of the embodiments of the present disclosure, it should be noted that, unless otherwise expressly specified and defined, the terms "install," "bond," "connected with," and "connected to" should be understood in a broad sense. For example, a connection may be a fixed connection, or a detachable connection, or an integral connection; may be a mechanical connection or an electrical connection; may be a direct connection, or an indirect connection by an intermediate medium, and or an internal connection between two elements. For those of ordinary skills in the art, the specific meaning of the aforementioned terms in the present disclosure can be understood in specific contexts.

Described above are merely preferred embodiments of the present disclosure, which are not intended to limit the present disclosure. Any modifications, equivalent substitutions, improvements and the like made within the spirit and principle of the present disclosure shall fall within the protection scope of the present disclosure.

What is claimed is:

1. A drive backplane for a light-emitting diode, comprising a substrate and a drive structure on the substrate, the drive structure comprising a thin-film transistor and a stress relief structure; wherein
   the thin-film transistor comprises an active layer on the substrate, a first insulation layer covering the active layer, and a first gate on the first insulation layer; wherein the active layer comprises a channel region, a first doped region and a second doped region; and
   the stress relief structure is on the first insulation layer and comprises a first metal strip on a first side of the first gate and a second metal strip on a second side of the first gate, wherein the first side is opposite to the second side; wherein an orthographic projection of the first metal strip on the substrate is within an orthographic projection of the first doped region of the active layer on the substrate; and an orthographic projection of the second metal strip on the substrate is within an orthographic projection of the second doped region of the active layer on the substrate.

2. The drive backplane for the light-emitting diode according to claim 1, wherein the first metal strip and the second metal strip have a rectangular or arched cross-sectional shape in a plane perpendicular to the substrate.

3. The drive backplane for the light-emitting diode according to claim 1, wherein the first metal strip and the second metal strip are from 2.0 μm to 3.0 μm in width.

4. The drive backplane for the light-emitting diode according to claim 1, wherein a spacing distance between the first metal strip and the first gate is from 1.5 μm to 2 μm, and a spacing distance between the second metal strip and the first gate is from 1.5 μm to 2 μm.

5. The drive backplane for the light-emitting diode according to claim 1, wherein the thin-film transistor further comprises a second insulation layer, a third insulation layer, a source electrode, and a drain electrode; wherein
   the second insulation layer covers the first gate, the first metal strip and the second metal strip,
   the third insulation layer is on the second insulation layer, and is provided with a first via hole and a second via hole, wherein the first doped region is exposed by the first via hole, and the second doped region is exposed by the second via hole; and
   the source electrode and the drain electrode are on the third insulation layer, wherein the source electrode connected to the first doped region by the first via hole and the drain electrode connected to the second doped region by the second via hole, such that the first metal strip is disposed between the first gate and the first via hole, and the second metal strip is disposed between the first gate and the second via hole.

6. The drive backplane for the light-emitting diode according to claim 5, wherein a spacing distance between the first metal strip and the first via hole is from 1.5 μm to 2 μm, and a spacing distance between the second metal strip and the second via hole is from 1.5 μm to 2 μm.

7. The drive backplane for the light-emitting diode according to claim 1, wherein the first metal strip and the second metal strip extend in an extending direction parallel to the first gate, and lengths of the first metal strip and the second metal strip in the extending direction are greater than or equal to a length of the active layer in the extending direction.

8. A method for preparing a drive backplane for a light-emitting diode, comprising:
   forming an active layer on a substrate, wherein the active layer comprises a channel region, a first doped region, and a second doped region;
   forming a first insulation layer covering the active layer; and
   forming a first gate and a stress relief structure on the first insulation layer by a single patterning process, wherein the stress relief structure comprises a first metal strip on a first side of the first gate and a second metal strip on a second side of the first gate.

9. The method according to claim 8, wherein the first metal strip and the second metal strip have a rectangular or arched cross-sectional shape in a plane perpendicular to the substrate.

10. The method according to claim 8, wherein the first metal strip and the second metal strip are from 2.0 μm to 3.0 μm in width.

11. The method according to claim 8, wherein a spacing distance between the first metal strip and the first gate is from 1.5 μm to 2 μm, and a spacing distance between the second metal strip and the first gate is from 1.5 μm to 2 μm.

12. The method according to claim 8, wherein the method further comprises:
   forming a second insulation layer covering the first gate, the first metal strip, and the second metal strip;
   forming a third insulation layer on the second insulation layer, wherein the third insulation layer is provided with a first via hole and a second via hole, the first doped region is exposed by the first via hole, and the second doped region is exposed by the second via hole; and forming a source electrode and a drain electrode on the third insulation layer, wherein the source electrode is connected to the first doped region by the first via hole, and the drain electrode is connected to the second doped region by the second via hole, such that the first metal strip is disposed between the first gate and the first via hole and the second metal strip is disposed between the first gate and the second via hole.

13. The method according to claim 12, wherein a spacing distance between the first metal strip and the first via hole is from 1.5 μm to 2 μm, and a spacing distance between the second metal strip and the second via hole is from 1.5 μm to 2 μm.

14. The method according to claim 8, wherein an orthographic projection of the first metal strip on the substrate is within an orthographic projection of the first doped region of the active layer on the substrate; and an orthographic projection of the second metal strip on the substrate is within an orthographic projection of the second doped region of the active layer on the substrate.

15. The method according to claim 8, wherein the first metal strip and the second metal strip extend in an extending direction parallel to the first gate, and lengths of the first metal strip and the second metal strip in the extending direction are greater than or equal to a length of the active layer in the extending direction.

16. A display device, comprising a drive backplane for a light-emitting diode; wherein the drive backplane for the light-emitting diode comprises: a substrate and a drive structure on the substrate, the drive structure comprising a thin-film transistor and a stress relief structure; wherein the thin-film transistor comprises an active layer on the substrate, a first insulation layer covering the active layer, and a first gate on the first insulation layer; wherein the active layer comprises a channel region, a first doped region and a second doped region; and the stress relief structure is on the first insulation layer and comprises a first metal strip on a first side of the first gate and a second metal strip on a second side of the first gate, wherein the first side is opposite to the second side; wherein an orthographic projection of the first metal strip on the substrate is within an orthographic projection of the first doped region of the active layer on the substrate; and an orthographic projection of the second metal strip on the substrate is within an orthographic projection of the second doped region of the active layer on the substrate.

17. The display device according to claim 16, wherein the first metal strip and the second metal strip have a rectangular or arched cross-sectional shape in a plane perpendicular to the substrate.

18. The display device according to claim 16, wherein the first metal strip and the second metal strip are from 2.0 μm to 3.0 μm in width.

19. The display device according to claim 16, wherein a spacing distance between the first metal strip and the first gate is from 1.5 μm to 2 μm, and a spacing distance between the second metal strip and the first gate is from 1.5 μm to 2 μm.

* * * * *